(12) United States Patent
Anderten et al.

(10) Patent No.: US 11,569,536 B2
(45) Date of Patent: Jan. 31, 2023

(54) ELECTRICAL ENERGY STORE AND METHOD FOR IDENTIFYING A STORAGE MODULE TYPE OF AN ELECTRICAL ENERGY STORE

(71) Applicant: Bayerische Motoren Werke Aktiengesellschaft, Munich (DE)

(72) Inventors: Timo Anderten, Munich (DE); Florian Pritscher, Munich (DE); Michael Schneider, Munich (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 344 days.

(21) Appl. No.: 16/851,917

(22) Filed: Apr. 17, 2020

(65) Prior Publication Data
US 2020/0243921 A1 Jul. 30, 2020

Related U.S. Application Data

(63) Continuation of application No. PCT/EP2018/078344, filed on Oct. 17, 2018.

(30) Foreign Application Priority Data

Oct. 18, 2017 (DE) ...................... 10 2017 218 562.7

(51) Int. Cl.
*G01R 31/389* (2019.01)
*H01M 10/48* (2006.01)
(Continued)

(52) U.S. Cl.
CPC ............ *H01M 10/486* (2013.01); *G01K 7/16* (2013.01); *G01R 31/389* (2019.01);
(Continued)

(58) Field of Classification Search
None
See application file for complete search history.

(56) References Cited

U.S. PATENT DOCUMENTS 5,489,834 A 2/1996 Pitkanen
2005/0231169 A1* 10/2005 Seo ..................... H01M 50/581
374/E7.031
(Continued)

FOREIGN PATENT DOCUMENTS

CN 105070975 A 11/2015
DE 10 2015 216 181 B3 8/2016
(Continued)

OTHER PUBLICATIONS

International Search Report (PCT/ISA/210) issued in PCT Application No. PCT/EP2018/078344 dated Nov. 16, 2018 with English translation (four (4) pages).
(Continued)

*Primary Examiner* — Jas A Sanghera
(74) *Attorney, Agent, or Firm* — Crowell & Moring LLP

(57) ABSTRACT

An electrical energy store has a plurality of storage modules, each of which has at least one temperature sensor string having a temperature sensor in the form of a temperature-dependent resistor for measuring the storage module temperature, and a battery control unit, which, based on the resistance values of the temperature sensor strings, determines the temperatures at the respective temperature sensors. The battery control unit is designed to determine a respective storage module type based on the measured resistance values of the temperature sensor strings. A method for identifying a storage module type, includes the steps: detecting a resistance value of at least one temperature sensor string having a temperature sensor, determining the temperatures present at the respective temperature sensors via a battery control unit on the basis of the resistance values
(Continued)

of the temperature sensor strings, and determining a storage module type on the basis of the resistance value of the at least one temperature sensor string per storage module.

11 Claims, 3 Drawing Sheets

(51) Int. Cl.
  *G01K 7/16* (2006.01)
  *H02J 7/00* (2006.01)
(52) U.S. Cl.
  CPC .... *H02J 7/00047* (2020.01); *H02J 7/007194* (2020.01); *H01M 2220/20* (2013.01)

(56) References Cited

U.S. PATENT DOCUMENTS

| | | | |
|---|---|---|---|
| 2008/0079446 A1* | 4/2008 | Taylor | G01K 7/16 374/E7.018 |
| 2008/0198898 A1 | 8/2008 | Taylor et al. | |
| 2010/0295503 A1 | 11/2010 | Bourilkov et al. | |
| 2012/0050054 A1* | 3/2012 | Fujiwara | B60L 53/65 340/636.1 |
| 2018/0102527 A1 | 4/2018 | Hildinger et al. | |

FOREIGN PATENT DOCUMENTS

| | | |
|---|---|---|
| EP | 0 572 152 A2 | 12/1993 |
| EP | 1 708 334 A2 | 10/2006 |

OTHER PUBLICATIONS

German-language Written Opinion (PCT/ISA/237) issued in PCT Application No. PCT/EP2018/078344 dated Nov. 16, 2018 (six (6) pages).

German-language Search Report issued in German Application No. 10 2017 218 562.7 dated Aug. 23, 2018 with partial English translation (11 pages).

* cited by examiner

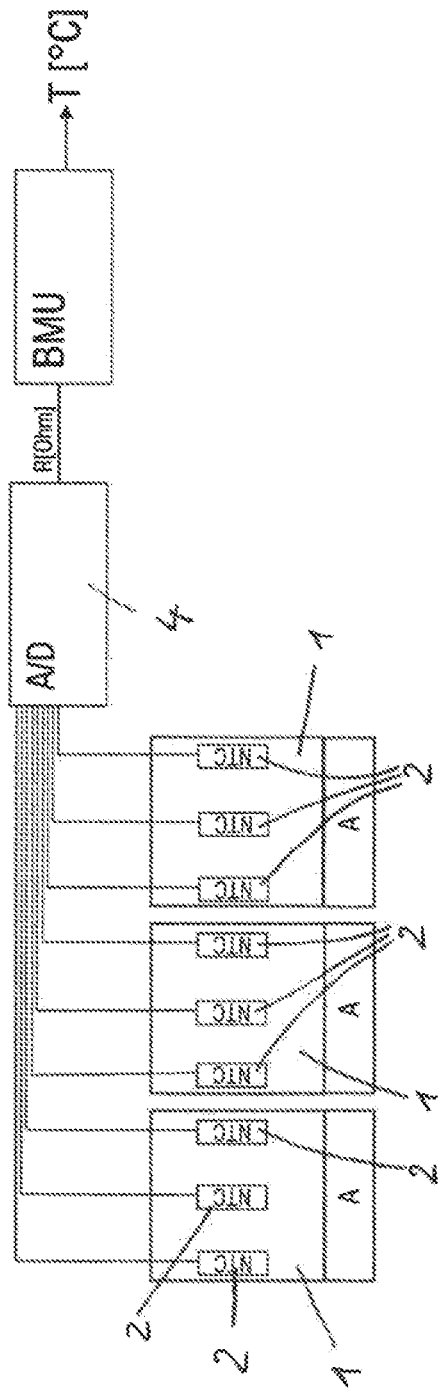
Fig. 1 – Prior art
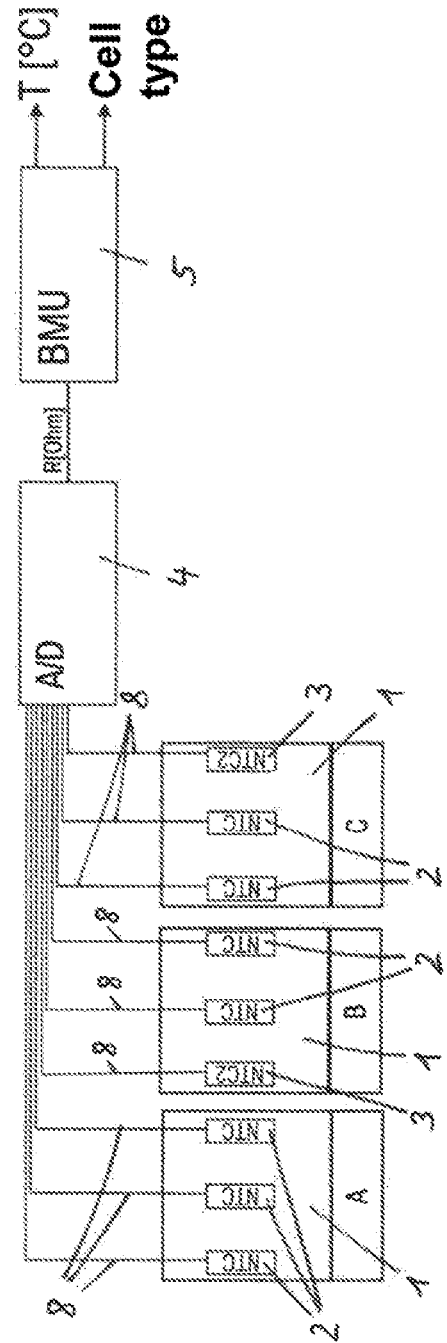
Fig. 2

ELECTRICAL ENERGY STORE AND METHOD FOR IDENTIFYING A STORAGE MODULE TYPE OF AN ELECTRICAL ENERGY STORE

CROSS REFERENCE TO RELATED APPLICATIONS

This application is a continuation of PCT International Application No. PCT/EP2018/078344, filed Oct. 17, 2018, which claims priority under 35 U.S.C. § 119 from German Patent Application No. 10 2017 218 562.7, filed Oct. 18, 2017, the entire disclosures of which are herein expressly incorporated by reference.

BACKGROUND AND SUMMARY OF THE INVENTION

The invention relates to an electrical energy store and to a method for identifying a storage module type of an electrical energy store.

An electrical energy store, for example a lithium ion battery, as is conventionally used in the automotive field as a traction battery, that is to say as an energy source for driving the vehicle, comprises a plurality of storage modules, of which each in turn has a plurality of storage cells connected in series or in parallel. In the event of a fault within the energy store, for example a faulty storage cell, currently the smallest exchangeable unit is usually in practice a storage module. However, such storage modules may differ, despite identical geometry and an identical connection, that is to say there are storage modules of different type with the same geometry and connections. The different storage module types may differ, for example, in terms of their interconnection (for example series or parallel connection) and/or their capacity. Furthermore, the electrical or chemical properties and safety-relevant limits can differ in the storage module types.

When exchanging a faulty storage module, it is therefore necessary to identify the storage module that is newly installed in order, on the one hand, to ensure that the storage module is suitable for installation in the corresponding energy store and possibly, on the other hand, to prepare a battery control unit for a new/other storage module type.

Currently, in practice, such identification during exchange of a storage module takes place based on a barcode or data matrix code (DMC) applied to the storage module. However, this does not guarantee that the person exchanging the storage module avoids mixing up storage modules after successful identification and before installation of the storage module.

It is an object of the present invention to improve identification of a storage module type of an electrical energy store. This object is achieved by way of an electrical energy store, a method for identifying a storage module type of an electrical energy store, and a motor vehicle, in accordance with the claimed invention.

According to an exemplary embodiment of the invention, an electrical energy store includes a plurality of storage modules, which are connected electrically in series or in parallel and which each have a plurality of storage cells connected electrically in series or in parallel, wherein the storage modules each have at least one temperature sensor string having a temperature sensor in the form of a temperature-dependent resistor for measuring the storage module temperature, and a battery control unit, which is connected to the temperature sensors by way of the temperature sensor strings and which determines the temperatures present at the respective temperature sensors based on the resistance values of the temperature sensor strings. The battery control unit is adapted to determine a storage module type based on the measured resistance values of the temperature sensor strings.

The advantage of this exemplary embodiment consists in the fact that temperature sensors that are present anyway can be used to identify the storage modules; temperature sensors with different rated resistances have to be installed only for encoding the storage modules or alternatively identical temperature sensors in which one or more is connected in series with a resistor. As a result, reliable identification of the storage modules without considerable additional costs can be achieved. The identification of storage modules serves to ensure that during an exchange of individual storage modules only those storage modules that are permitted for the relevant energy store are installed. It is therefore possible to check the input of a service worker (barcode scanner etc.) from which a new storage module has been installed. This provides the opportunity of double or redundant checking as to whether the correct module has been installed. On the other hand, identification can be used to switch a parameter set matching the storage module type in the battery control unit. That is to say the battery control unit recognizes, for example, when a storage module of a new construction type with a greater capacity has been installed, and selects the matching parameter set for the storage module type, with the result that the storage module is actuated by the battery control unit correctly and possibly differently to the other storage modules. Furthermore, the battery control unit can select a corresponding cell data input and safety limits based on the identification.

According to a further exemplary embodiment of the invention, the storage modules each have a plurality of temperature sensor strings having temperature sensors, and the battery control unit is adapted to determine a respective temperature sensor type of the temperature sensors based on the measured resistance values of the temperature sensor strings and to determine the storage module type for each storage module from a combination of the temperature sensor types. The advantage of this exemplary embodiment consists in a plurality of potential storage module types being able to be distinguished as a result.

According to a further exemplary embodiment of the invention, the temperature sensor types differ in delivering different resistance values at a particular temperature. The temperature sensor types are accordingly able to be distinguished by way of different rated resistances. The encoding by means of the temperature-dependent resistors that are required anyway makes this exemplary embodiment cost-effective.

According to a further exemplary embodiment of the invention, the battery control unit is adapted to also determine the storage module type based on the position at which a corresponding temperature sensor type is arranged in the storage module type to be determined. The position of a temperature sensor type also becomes apparent with a plug configuration of the connection leading away from the temperature sensors, wherein a particular position of the temperature sensor on the storage module can be assigned to a particular pin or a particular socket on the plug. The advantage of this exemplary embodiment consists in that even more potential storage module types are able to be distinguished as a result.

According to a further exemplary embodiment of the invention, the storage modules each have a plurality of temperature sensor strings having temperature sensors, and the battery control unit is adapted to determine a storage module type for each storage module based on the measured resistance values of the temperature sensor strings and from a combination of the resistance values. In this case, temperature sensors with different rated resistances may have to be installed for encoding the storage modules or alternatively identical temperature sensors in which one or more is connected in series with a resistor for encoding.

The invention furthermore provides a method for identifying a storage module type of an electrical energy store, which has a plurality of storage modules, which are connected electrically in series or in parallel and which each have a plurality of storage cells connected electrically in series or in parallel, wherein the method has the following steps:

detecting a resistance value in each case of at least one temperature sensor string having a temperature sensor for measuring the storage module temperature, and determining the temperatures present at the respective temperature sensors by means of a battery control unit based on the resistance values of the temperature sensor strings, and determining a storage module type based on the resistance value of the at least one temperature sensor string for each storage module. By way of the method, the same advantages as already described above in connection with the first mentioned exemplary embodiment of the electrical energy store can be achieved. In particular, the method is carried out only under particular boundary conditions, for example during the servicing of the motor vehicle, and the result is then stored.

According to an exemplary embodiment of the invention, in the step of determining the storage module type, a respective temperature sensor type of the temperature sensor is determined based on the measured resistance value of the associated temperature sensor string, for each storage module the respective storage module types of a plurality of temperature sensors are detected for each storage module, and the storage module type is determined from a combination of the temperature sensor types for each storage module. The advantage of this exemplary embodiment consists in a plurality of potential storage module types being able to be distinguished as a result.

According to a further exemplary embodiment of the method, when the temperature sensor types are determined, the temperature sensor types are different in terms of their resistance values at a particular temperature. The encoding by means of temperature-dependent resistors that are required anyway makes the implementation of this exemplary embodiment cost-effective.

According to a further exemplary embodiment of the method, the storage module type is determined by taking into account which temperature sensor type is located at which position in the storage module. The advantage of this exemplary embodiment consists in even more potential storage module types being able to be distinguished as a result.

According to a further exemplary embodiment of the method, the method further has the step of determining whether the storage module type is permitted for the energy store. This increases the operational reliability of the electrical energy store.

The present invention furthermore provides a motor vehicle having such an electrical energy store.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 is a schematic illustration of an electrical energy store of the prior art.

FIG. 2 is a schematic illustration of an electrical energy store according to an exemplary embodiment of the invention.

DETAILED DESCRIPTION OF THE DRAWINGS

Figure 3:
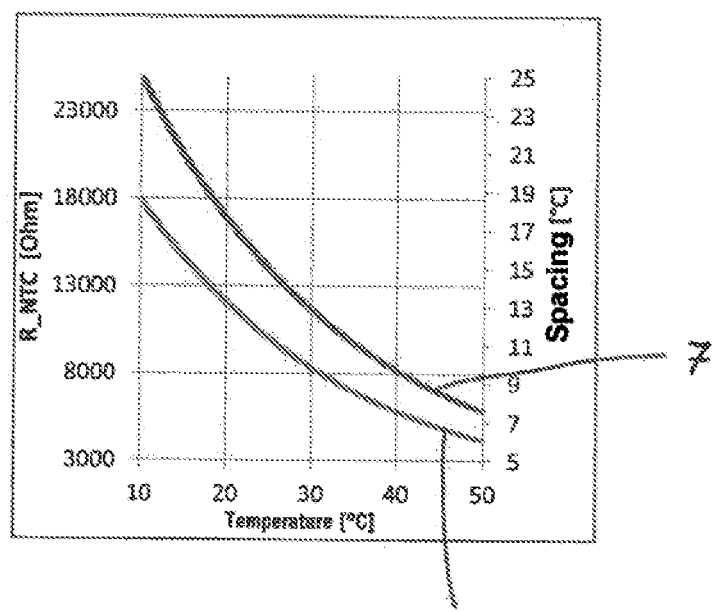
FIG. 3 is a temperature/resistance graph of the temperature sensors for identifying the storage module type.

FIG. 2 shows an electrical energy store according to an exemplary embodiment of the invention. In particular, the electrical energy store is arranged in a motor vehicle in order to provide electrical energy for driving the motor vehicle. The store comprises a plurality of storage modules 1. The storage modules 1 are connected to one another electrically in series or in parallel. Each of the storage modules has a plurality of storage cells connected electrically in series or in parallel (not illustrated). The storage cells are electrochemical cells, in particular lithium ion rechargeable batteries. A plurality of temperature sensors 2 and 3 are provided in each of the storage modules 1 in order to monitor the temperature of each of the storage modules 1. In the exemplary embodiment illustrated, there are three temperature sensors for each storage module 1; however, another number of temperature sensors 2, 3 may also be provided, for example one, two, four or more than four. The three illustrated temperature sensors 2 and 3 are physically distributed over the storage module 1, for example a first temperature sensor is located on a longitudinal end of the storage module 1, a second temperature sensor is located in the center of the storage module 1 and a third temperature sensor is located at the other longitudinal end of the storage module 1, in order to cover the temperature measurement of the storage module physically as well as possible over the entire storage module. The temperature sensors 2 and 3 are NTC resistance sensors, the resistance value of which changes depending on the temperature. However, other temperature-dependent resistance sensors could also be used, for example PTC resistance sensors. Each of the temperature sensors 2, 3 is electrically connected to a battery control unit 5 by means of a temperature sensor string 8 assigned to the respective temperature sensor, for example directly or via an interconnected analog-to-digital converter 4. The temperature sensor string 8 is an electrical conductor, for example a wire, a cable, a conductor track, etc., which connects the associated temperature sensor 2 to the analog-to-digital converter 4 and/or to the battery control unit 5 and transmits the measurement information of the assigned temperature sensor 2 to the analog-to-digital converter 4 and/or to the battery control unit 5. In this case, the assigned temperature sensor string 8 transmits only the information of the associated temperature sensor 2 and not the information of the other temperature sensors 2. The other temperature sensors 2 are each assigned their own temperature sensor strings 8.

As can be seen in FIG. 1, which schematically illustrates an electrical energy store from the prior art, such temperature sensors are already present in storage modules that are used today. This constitutes an advantage of the present invention that temperature sensors do not have to be provided in addition but are provided anyway. In contrast to the prior art, in which three identical temperature sensors 2 are provided for each storage module 1, in the present invention temperature sensors of different types are provided, as a result of which encoding can be achieved depending on at which position which type is located. In the simplest case, however, the invention can also be realized only with one temperature sensor 2, 3 for each storage module 1, wherein the storage module types are able to be distinguished based on different temperature sensor types. As an alternative to encoding by means of different temperature sensor types, it is also possible to install temperature sensors of the same type, wherein encoding is achieved by virtue of a resistor being connected electrically in series with one or more of the temperature sensors of a storage module 1, such that a series resistor can also be provided in addition to a temperature sensor in a temperature sensor string 8.

Back to FIG. 2, for example two different types of temperature sensor are provided here, namely temperature sensors 2 of a first type and temperature sensors 3 of a second type. The temperature sensor types are distinguished here for example by different rated resistances at particular rated temperatures. In this case, the rated temperature is generally 25° C. That is to say at a particular temperature the temperature sensors have a different resistance value depending on type. The invention is not limited to two different types of temperature sensor but instead a plurality of different types of temperature sensor can also be provided. In this case, it holds true that the more different types of temperature sensor are provided, the more different types of storage module are able to be distinguished.

In this case, a role as first temperature sensor, second temperature sensor or third temperature sensor is assigned to each of the temperature sensors 2, 3, depending on how many temperature sensors 2, 3 are provided for each storage module 1. For the battery control unit 5, this assigned role can be identified for example by means of a plug configuration of a plug by means of which the temperature sensor strings 8 are connected to the battery control unit 5. In this case, the first temperature sensor is preferably located physically substantially at the same position for all storage modules 1 of the energy store, the second temperature sensor is likewise preferably located physically substantially at the same position for all storage modules of the energy store and the same applies for the third temperature sensor. In particular, the first temperature sensor is located at one end of the storage module, the third temperature sensor is located at the opposite end of the storage module and the second temperature sensor is located between the first and third temperature sensor. The selection of which temperature sensor type the first, second and third temperature sensor forms determines an unambiguous encoding and identification of the storage module 1. For example, in the present exemplary embodiment, a storage module type A (left-hand storage module 1 in FIG. 2) is identified by the first, second and third temperature sensor each being formed by a temperature sensor 2 of the first type. A storage module type B (central storage module 1 in FIG. 2) is identified by the first temperature sensor being formed by a temperature sensor 3 of the second type and the second and third temperature sensor each being formed by a temperature sensor 2 of the first type. A storage module type C (right-hand storage module 1 in FIG. 2) is identified by the first and second temperature sensor being formed by a temperature sensor 2 of the first type and the third temperature sensor being formed by a temperature sensor 3 of the second type.

Each temperature sensor 2 and 3 is connected to the battery control unit (BMU) 5 via one of the temperature sensor strings 8 via the analog-to-digital converter 4. The battery control unit 5 receives the resistance values of the individual temperature sensors 2 and 3 and initially determines therefrom a temperature sensor type and from the combination of temperature sensor types a storage module type for each storage module 1. When the combination of temperature sensor types is determined, it is preferably concomitantly taken into account at which position which temperature sensor type is located, that is to say which type the first temperature sensor is, which type the second temperature sensor is and which type the third temperature sensor is.

FIG. 3 shows a temperature/resistance graph of two temperature sensors 2 and 3 of different type, wherein the curve 6 represents a resistance/temperature profile of the temperature sensor 2 of the first type and the curve 7 represents a resistance/temperature profile of the temperature sensor 3 of the second type. The graph represents an assignment based on which the battery control unit 5 can determine a temperature value from an ascertained resistance value with knowledge of the temperature sensor type.

As can be seen, there is a particular spacing between the curves, both in terms of the resistance value and the resulting temperature value, that is to say at a particular temperature, for example 20° C., the temperature sensor of the first type has a lower resistance than the temperature sensor of the second type. There is usually only a particular maximum temperature spread between the individual temperature sensors of a storage module 1. That is to say the temperature prevailing at the temperature sensors differs within a storage module 1 by for example at most 5° C. If it is now determined by means of the individual temperature sensors 2, 3 that there is a temperature difference that is greater than the particular maximum temperature spread using the curve 6, the battery control unit 5 then determines that it must be a temperature sensor of the other type, namely of the second type. To reliably identify the different temperature sensor types, it is advantageous when the spacing between adjacent curves is greater than the maximum temperature spread that usually occurs between temperature sensors of the same storage module during normal operation. To prevent an unusually large temperature spread occurring, there are the following options: since the temperature across the storage module balances/homogenizes over time, the identification can be improved in terms of the accuracy thereof when a plurality of measurements are carried out at a time interval with respect to one another. As an alternative to a plurality of measurements, the identification can be improved in terms of the accuracy thereof when the identification is carried out under prescribed environmental climate conditions, for example after the energy store has been kept at a particular environmental temperature over a particular period such that no unusual temperature spread occurs.

If three temperature values that are not spaced apart from one another by more than a particular limit value (that is to say the maximum temperature spread) are accordingly produced in the determination of the temperatures of the three temperature sensors 2, 3, then they are temperature sensors of the same type, wherein different temperatures are possibly present at the temperature sensors. If in the determination of the temperatures of the three temperature sensors 2, 3 it results that in one or more temperature sensors there is a temperature spread that is greater than the limit value, the battery control unit can then determine therefrom that this temperature sensor and a temperature sensor of another type are involved.

As an alternative thereto, it is possible, in the case of a plurality of temperature sensors for each storage module (for example three, as illustrated in FIG. 2), for one of the temperature sensors 2 for each storage module 1, for example the second temperature sensor 2 (this corresponds in FIG. 2 to the respective central temperature sensor), to not be varied, that is to say the second temperature sensor has the same resistance value in all storage module types. One of the temperature sensors 2 for each storage module 1 therefore provides a reliable reference for comparing the other temperature sensors of the same storage module 1 with this as reference.

Figure 4:
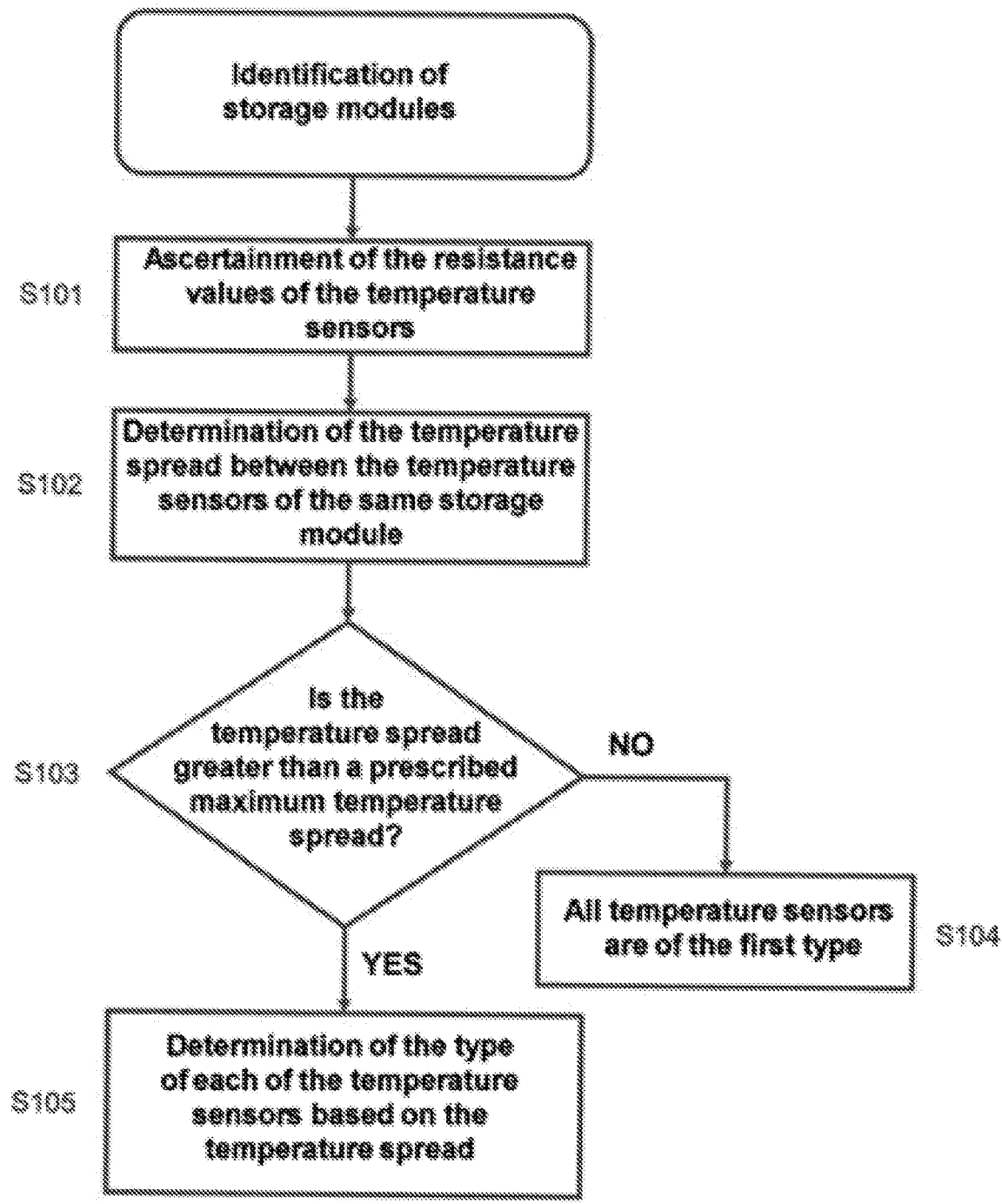
FIG. 4 is a flow diagram, which illustrates an exemplary embodiment of a method for identifying a storage module.

FIG. 4 is a flow diagram, which illustrates an exemplary embodiment of a method for identifying a storage module. The method can be executed to identify each of the storage modules 1. In particular, the method is carried out after the exchange of a storage module 1 for the exchanged storage module 1. According to this method, in a step S101 the resistance values of the temperature sensors 2, 3 of the storage module 1 to be identified are ascertained by the battery control unit 5. A temperature prevailing at the respective temperature sensors 2, 3 can be ascertained from the resistance values using the diagram according to FIG. 3. For example, the temperature is initially determined here as reference for the first temperature sensor type by means of the curve 6 (or the lowermost curve of the resistance/temperature profiles). In step S102, the battery control unit 5 ascertains the temperature spread, that is to say how great the differences are between the ascertained temperature values of the temperature sensors 2, 3 for each storage module 1. For example, the lowest temperature could serve as reference since when using a temperature sensor 2 of the first type it is assumed that the lowest detected temperature can be ascribed to a temperature sensor of the first type. It is therefore advantageous when in at least one of the plurality of temperature sensors 2, 3 one is a temperature sensor of the first type, effectively as reference. In step S103, the ascertained temperature spreads, that is to say the ascertained difference values, are compared with a prescribed maximum temperature spread. If the temperature spread of a particular temperature sensor is lower than the maximum temperature spread, it must be a temperature sensor of the same type, which corresponds in FIG. 4 to step S104. If the temperature spread of a particular temperature sensor is greater than the maximum temperature spread, it must be a temperature sensor of a different type and the method continues to step S105. If only temperature sensors of two different types are used, as is the case in the exemplary embodiment illustrated in FIG. 2, it follows from the assessment that it is a temperature sensor of a different type that it is a temperature sensor 3 of the second type. When more than two types of temperature sensor are used, the individual types can be distinguished from one another based on the extent of the temperature spread.

Whereas the invention has been illustrated and described in detail in the drawings and the preceding description, this illustration and description should be understood as illustrative or exemplary and not restrictive, and the intention is not to restrict the invention to the exemplary embodiments disclosed. The mere fact that particular features are mentioned in different dependent claims is not intended to indicate that a combination of these features also could not be advantageously used.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An electrical energy store, comprising:
    a plurality of storage modules, which are connected electrically in series or in parallel and which each have a plurality of storage cells connected electrically in series or in parallel, wherein the storage modules each have at least one temperature sensor string having a temperature sensor in a form of a temperature-dependent resistor for measuring the storage module temperature; and
    a battery control unit, which is connected to the temperature sensors by way of the temperature sensor strings and which determines temperatures present at the respective temperature sensors based on measured resistance values of the temperature sensor strings, wherein the battery control unit is adapted to determine a storage module type based on a difference in the determined temperatures exceeding a threshold value, as determined by the measured resistance values of the temperature sensor strings.

2. The electrical energy store according to claim 1, wherein the storage modules each have a plurality of temperature sensor strings having temperature sensors, and
    the battery control unit is adapted to determine a respective temperature sensor type of the temperature sensors based on the measured resistance values of the temperature sensor strings and to determine the storage module type for each storage module from a combination of the temperature sensor types.

3. The electrical energy store according to claim 2, wherein the temperature sensor types differ in delivering different resistance values at a particular temperature.

4. The electrical energy store according to claim 2, wherein the battery control unit is adapted to also determine the storage module type based on a position at which a corresponding temperature sensor type is arranged in the storage module type to be determined.

5. The electrical energy store according to claim 1, wherein
    the storage modules each have a plurality of temperature sensor strings having temperature sensors, and
    the battery control unit is adapted to determine a storage module type for each storage module based on measured resistance values of the temperature sensor strings and from a combination of the resistance values.

6. A motor vehicle comprising an electrical energy store according to claim 1.

7. A method for identifying a storage module type of an electrical energy store, which has a plurality of storage modules, which are connected electrically in series or in parallel and which each have a plurality of storage cells connected electrically in series or in parallel, the method comprising:
    measuring a resistance value in each case of at least one temperature sensor string having a temperature sensor for measuring the storage module temperature;

determining temperatures present at the respective temperature sensors by way of a battery control unit based on the measured resistance values of the temperature sensor strings; and determining a storage module type for each storage module based on a difference in the determined temperatures exceeding a threshold value, as determined by the measured resistance value of the temperature sensor strings.

8. The method according to claim 7, wherein in the step of determining the storage module type:

a respective temperature sensor type of the temperature sensor is determined based on the measured resistance value of the associated temperature sensor string, and the storage module type is determined from a combination of the temperature sensor types for each storage module.

9. The method according to claim 8, wherein, when the temperature sensor types are determined, the temperature sensor types are distinguished in terms of their resistance values at a particular temperature.

10. The method according to claim 9, wherein the storage module type is determined based on which temperature sensor type is located at which position in the storage module.

11. The method according to claim 7, further comprising:
determining whether the storage module type is permitted for the energy store.

* * * * *